(12) United States Patent
Yahagi et al.

(10) Patent No.: US 7,336,136 B2
(45) Date of Patent: Feb. 26, 2008

(54) HIGH FREQUENCY SEMICONDUCTOR INTEGRATED CIRCUIT DEVICE, WIRELESS ELECTRIC UNIT AND WIRELESS COMMUNICATION SYSTEM

(75) Inventors: Koichi Yahagi, Takasaki (JP); Kazuhiko Hikasa, Hamura (JP); Ryoichi Takano, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/546,329

(22) Filed: Oct. 12, 2006

(65) Prior Publication Data

US 2007/0026834 A1  Feb. 1, 2007

Related U.S. Application Data

(63) Continuation of application No. 10/870,914, filed on Jun. 21, 2004, now Pat. No. 7,132,900.

(30) Foreign Application Priority Data

Aug. 22, 2003  (JP)  ............................. 2003-208334

(51) Int. Cl.
*H04B 1/04* (2006.01)
*H01P 5/00* (2006.01)
*H03B 5/24* (2006.01)

(52) U.S. Cl. ...................... 331/108 C; 331/76; 331/74; 333/33; 333/246; 455/126

(58) Field of Classification Search ............ 331/108 C, 331/76, 74; 333/33, 246; 455/126
See application file for complete search history.

(56) References Cited

U.S. PATENT DOCUMENTS

| 5,434,545 | A |  | 7/1995 | Burchfield |
| 5,936,492 | A | * | 8/1999 | Shingyoji et al. ............ 333/246 |
| 6,201,454 | B1 | * | 3/2001 | Kinayman et al. ............ 333/33 |
| 6,295,442 | B1 |  | 9/2001 | Camp et al. |
| 6,369,666 | B1 | * | 4/2002 | Simon et al. ................ 332/100 |
| 6,646,343 | B1 |  | 11/2003 | Sharma et al. |
| 6,707,314 | B2 | * | 3/2004 | Kasahara et al. ............. 326/38 |
| 6,806,106 | B2 |  | 10/2004 | Leighton et al. |
| 2005/0176388 | A1 |  | 8/2005 | Yamawaki et al. |

OTHER PUBLICATIONS

"High Linearity RF Amplifier Design", P. Kenington, Artech House, Inc., 1979, p. 162.

* cited by examiner

*Primary Examiner*—Joseph Chang
(74) *Attorney, Agent, or Firm*—Mattingly, Stanger, Malur & Brundidge, P.C.

(57) ABSTRACT

A transmission oscillator of differential output configuration is incorporated into a high frequency IC. Further, an equivalent impedance having an impedance equivalent to the impedance connected with a regular output terminal is provided. Or, a dummy external terminal for outputting transmit signals in opposite phase is provided. One of the differential outputs of the transmission oscillator is inputted to the power amplifier through the regular output terminal. The other of the differential outputs is connected to the equivalent impedance or the dummy external terminal.

14 Claims, 6 Drawing Sheets

HIGH FREQUENCY SEMICONDUCTOR INTEGRATED CIRCUIT DEVICE, WIRELESS ELECTRIC UNIT AND WIRELESS COMMUNICATION SYSTEM

CROSS-REFERENCE

This is a continuation application of U.S. Ser. No. 10/870,914, filed Jun. 21, 2004 now U.S. Pat. No. 7,132,900.

The present application claims priority from Japanese patent application JP 2003-208334 filed on Aug. 22, 2003, the content of which is hereby incorporated by reference into this application.

BACKGROUND OF THE INVENTION

The present invention relates to a technology which is effectively applicable to the suppression of coupling noise or crosstalk from the output end of a transmission oscillator in a high frequency IC incorporating a transmission oscillator to other terminals. More particularly, the present invention relates to a technology which is effectively applicable to a high frequency semiconductor integrated circuit device and a wireless electric unit having a phase control loop for phase modulation and an amplitude control loop for amplitude modulation and a wireless communication system, such as cellular phone, incorporating the wireless electric unit.

One of conventional methods for wireless communication equipment (mobile communication equipment), such as cellular phone, is a method designated as GSM (Global System for Mobile Communication). The GSM uses a phase modulation method designated as GMSK (Gaussian Minimum Shift Keying) wherein the phase of carrier waves is shifted according to transmit data.

With respect to recent GSM cellular phones, a system designated as EDGE (Enhanced Data Rates for GMS Evolution) is nearing practical use. The EDGE has 3π/8 rotating 8-PSK (Phase Shift Keying) modulation mode for modulating carrier waves by phase control and amplitude control, in addition to GMSK modulation mode. While one bit of information per symbol is transmitted in GMSK modulation, three bits of information per symbol can be transmitted in 3π/8 rotating 8-PSK (hereafter, referred to as "8-PSK") modulation. Therefore, in EDGE mode, communication can be carried out at a higher transmission rate than in GMSK mode.

Conventionally, various methods have been known for implementing a modulation method wherein the phase component and the amplitude component of a transmit signal are respectively caused to bear information. One of such methods is that designated as polar-loop transmitter (for example, page 162 of "High Linearity RF Amplifier Design" written by Peter B. Kenington (Artech House, Inc., 1979). In the polar-loop transmitter, a signal to be transmitted is separated into a phase component and an amplitude component, and then these components are respectively fed back with a phase control loop and an amplitude control loop and thereby controlled. Thereafter, the components are synthesized in an amplifier and outputted.

With respect to wireless communication system, efforts have been made in these years to incorporate as many circuits as possible into one or several semiconductor integrated circuits to reduce a number of parts for the reduction of the size and cost of systems. One of such efforts is a technology for incorporating a transmission oscillator into a semiconductor integrated circuit provided with modulating and demodulating functions (hereafter, referred to as "high frequency IC"). With respect to high frequency IC constituting a GSM communication system, that with a transmission oscillator mounted on-chip has been developed and proposed by the present applicants et al. (Patent Document 1).

[Patent Document 1]

Japanese Patent Application No. 2003-048631 (Corresponding U.S. patent application: Ser. No. 10/373,046. Filing data in U.S.: Sep. 13, 2002)

SUMMARY OF THE INVENTION

The present inventors et al. considered a technology of incorporating a transmission oscillator into a high frequency IC which constitutes an EDGE communication system. As a result, the present inventors et al. found they had the problem described later. The polar-loop transmitter method in the EDGE system the present inventors, et al. considered is such that: with respect to phase control loop, the output of a transmission oscillator or the output of a high frequency power amplifier circuit (hereafter, referred to as "power amplifier") is detected. Then, the detected output is fed back to a phase comparator which compares it with a reference signal. With respect to amplitude control loop, the output of the power amplifier is detected, and fed back to an amplitude comparator which compares it with a reference signal. Such a polar-loop transmitter method is disclosed in a patent application filed by the present applicants et al. (Japanese Patent Application No. 2003-54042. Corresponding U.S. patent application: Ser. No. 10/373,031. Filing date in U.S.: May 31, 2002)

Systems, such as GSM and DCS (Digital Cellular System), which support only the GMSK modulation method only have to subject carrier waves to phase modulation according to transmit data and output them. For feedback control loop, therefore, only a phase control loop is sufficient. In the wireless communication system disclosed in Patent Document 1 above, only phase modulation is carried out in a quadrature modulator in a transmission circuit. Signals are up converted by a method designated as offset PLL method. If a transmission oscillator is incorporated into a high frequency IC, a feedback control loop for phase control can be so constituted that it is closed within a chip. Therefore, such problems as described later do not arise.

Meanwhile, the EDGE system which adopts the polar-loop transmitter method extracts the phase component and the amplitude component from a signal modulated by a modulator and separately carries out control. Then, the system composes vectors at a power amplifier and outputs them. For this reason, the system requires two feedback control loops: phase control loop and amplitude control loop. In addition, at least the amplitude control loop must be constituted as follows: the output level of a power amplifier placed in a stage subsequent to a transmission oscillator is detected and fed back to control the gain of the power amplifier.

Therefore, in a system wherein a power amplifier and a high frequency IC are constituted of separate semiconductor chips, a problem arises: if a transmission oscillator is incorporated into the high frequency IC, the oscillation signal of the transmission oscillator is outputted from the external terminal of the high frequency IC to the power amplifier external to the chip. In addition, the detection signal of a coupler which detects the transmission output power of the power amplifier is inputted to the external terminal of the high frequency IC. Then, the detection signal is supplied to an amplitude comparator internal to the IC chip through a feedback path.

Here, the transmit signal which is generated in the transmission oscillator in the high frequency IC and externally outputted and the feedback signal which is detected in the coupler and inputted to the high frequency IC are identical in frequency. That is, noise from the transmission oscillator side cannot be cut by a filter in the feedback path. The output level of the power amplifier is extraordinarily high, and the level of the detection signal of the coupler is also enhanced. To cope with this, the polar-loop transmitter communication system according to the previous invention proposed by the present inventors et al., the signal detected in the coupler is attenuated by an attenuator before it is inputted to the high frequency IC.

In the high frequency IC incorporating a transmission oscillator which the present inventors et al. intend to develop, the level of signal at the output pins of the transmission oscillator is approximately 10 dBm. Without special isolation provided, the level of noise which jumps from the output pins of the transmission oscillator into the input pins for feedback signal in the amplitude control loop is close to −40 dBm. Meanwhile, the present inventors et al. found that if a signal detected in the coupler is attenuated by the attenuator and then inputted to the high frequency IC, the signal must be attenuated by 45 dB or so.

For this reason, if the power amplifier operates, for example, at an output level of −11 dBm, which is the minimum output level in DCS, the input level of feedback signal in the amplitude control loop is −56 dBm. Hence, this is lower than the level (−40 dBm) of coupling noise from the output pins of the transmission oscillator. As a result, the present inventors et al. found that a problem arose: the output of the power amplifier cannot be controlled with accuracy. The high frequency IC here referred to is on the assumption that it is not in the bare chip state but it is sealed in a package.

Consequently, the present inventors et al. considered disposing both the output pins of the transmission oscillator and the input pins for feedback signal in the amplitude control loop in the farthest positions away from each other to enhance the isolation between both the pins. However, the result was substantially the same, and the present inventors et al. could not sufficiently reduce the level of coupling noise to the input pins for feedback signal in the amplitude control loop. The present inventors et al. also considered differential input method. The method is such that a circuit (mixer) which receives feedback signals in the amplitude control loop is provided with differential input constitution; at the same time, two pins corresponding to input terminal are provided, and coupling noise is inputted as common mode noise and thereby canceled out. However, the present inventors et al. found that only the differential input method could not sufficiently reduce the influences of coupling noise from the output pins of the transmission oscillator.

An object of the present invention is to provide a high frequency semiconductor integrated circuit device wherein in a wireless communication system having feedback control loops for controlling the phase and amplitude of transmit signals, the number of parts constituting the system can be reduced and the packaging density can be enhanced for size and cost reduction.

Another object of the present invention is to prevent the accuracy of control of the output power of a power amplifier from being impaired by coupling noise between the output pins of a transmission oscillator and the input pins for output level detection signal of an power amplifier in the following case: the transmission oscillator is incorporated into a communication semiconductor integrated circuit, such as high frequency IC, which constitutes a wireless communication system having feedback control loops for controlling the output of the power amplifier. The above and other objects and novel features of this invention will be apparent from the description in this specification and the accompanying drawings.

The following is a brief description of the gist of the representative elements of the invention laid open in this application:

A high frequency IC constitutes wireless communication equipment which has a phase control loop and an amplitude control loop. The phase control loop is for controlling the phase of carrier waves outputted from a transmission oscillator. The amplitude control loop is for controlling the amplitude of transmission output signals outputted from a power amplifier circuit. Thus, the wireless communication equipment is capable of transmission in GMSK modulation mode and transmission in 8-PSK modulation mode. A transmission oscillator of differential output constitution is incorporated into the high frequency IC. At the same time, the high frequency IC is provided with an equivalent impedance having an impedance equivalent to an impedance connected with a normal output terminal or a dummy external terminal for outputting transmit signals of opposite phase. One of the differential outputs of the transmission oscillator is inputted to the power amplifier through the normal output terminal, and the other of the differential outputs is connected with the equivalent impedance or the dummy external terminal.

Thus, the number of parts constituting the system can be reduced, and the packaging density can be enhanced. Further, electromagnetic fields produced from the differential output terminals of the transmission oscillator can be canceled out. Thus, coupling noise from the output pins of the transmission oscillator to the input pins for detection signals of the output level of the power amplifier and the amount of crosstalk can be reduced. Thereby, degradation in the accuracy of control of the output power of the power amplifier can be prevented.

As mentioned above the transmission oscillator is incorporated into the high frequency IC. This incorporation does not only include cases where all the elements constituting the transmission oscillator are incorporated. If the transmission oscillator is a circuit, such as LC resonance oscillator, provided with an inductance element, the following constitution is adopted: an external element is used for the inductance element, and the other constituent elements than the inductance element are formed over the same semiconductor chip as a modulator is formed. This is because with an on-chip inductance element, it is difficult to obtain desired characteristics. The above incorporation also includes such a case.

DETAILED DESCRIPTION OF THE PREFERRED EMBODIMENTS

Figure 1:
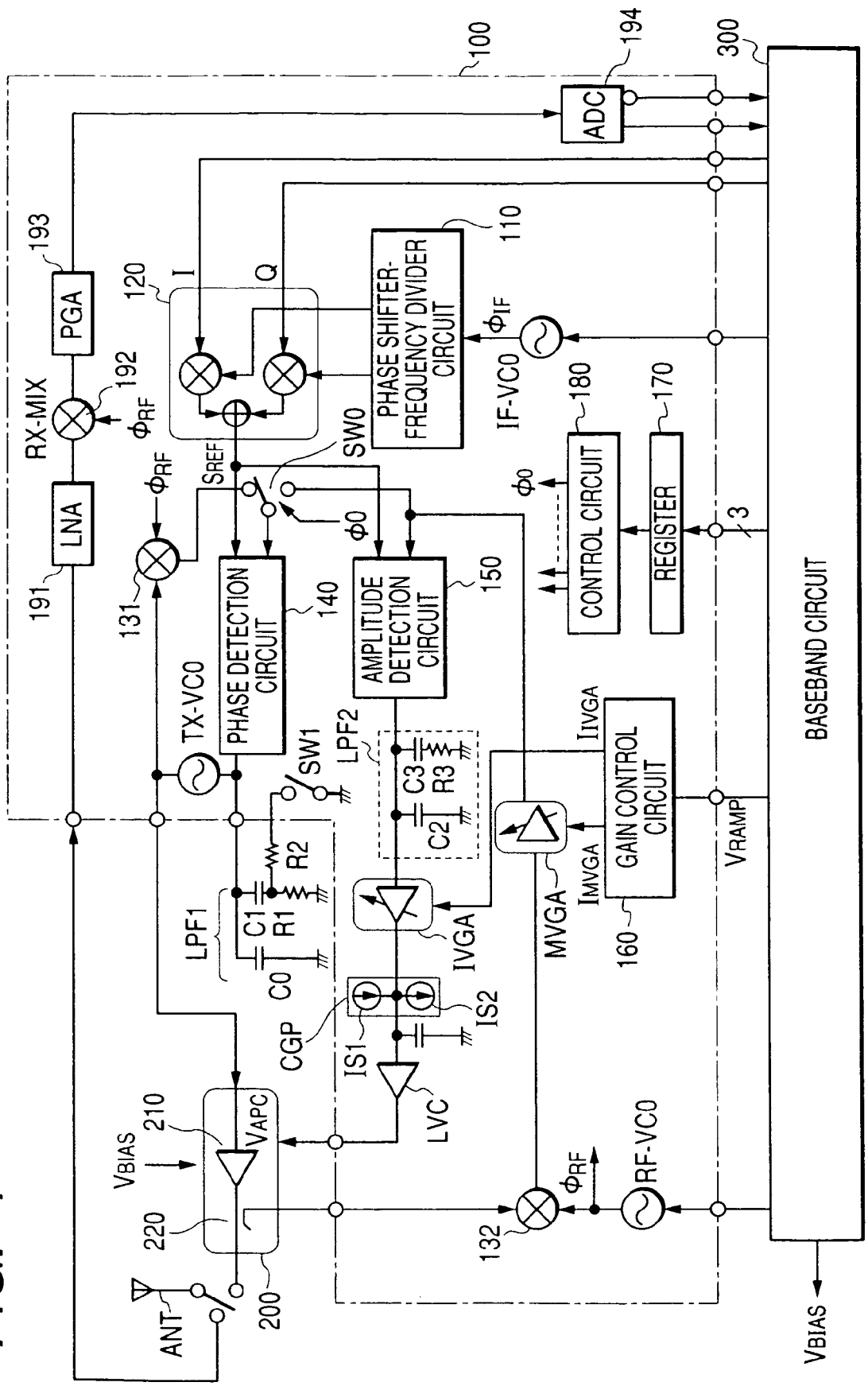
FIG. 1 is a block diagram schematically illustrating the constitution of an embodiment of a polar-loop transmitter wireless communication system to which the present invention is favorably applied.

FIG. 1 schematically illustrates the constitution of an embodiment of a polar-loop transmitter wireless communication system to which the present invention is favorably applied. The wireless communication system in FIG. 1 comprises: a high frequency IC 100 which is capable of GMSK modulation in the GSM system and 8-PSK modulation in the EDGE system and is formed as a semiconductor integrated circuit; a power module 200 including a power amplifier (high frequency power amplifier circuit) 210 which drives an antenna ANT and carries out transmission, a coupler 220 for detecting its transmission output power, and the like; and a baseband circuit 300 which generates I/Q signals based on transmit data (baseband signal) and generates control signals for the high frequency IC 100 and bias voltage VBIAS to the power amplifier 210 in the power module 200. The baseband circuit 300 can be formed as a semiconductor integrated circuit (IC) over one semiconductor chip.

In this embodiment, a reception-system circuit as well as a transmission-system circuit is formed over the high frequency IC 100 chip. The transmission-system circuit comprises: a modulation circuit 120; a transmission oscillator TxVCO which generates phase modulated transmit signals (carrier waves); and the like. The reception-system circuit comprises: a low noise amplifier (LNA) 191 which amplifies receive signals; a mixer (Rx-MIX) 192 which mixes together receive signals and oscillation signals from RF-VCO, and down converts the receive signals directly into baseband signals; a high gain programmable gain amplifier (PGA) 193 which amplifies receive signals to signals of a desired level; an A-D conversion circuit (ADC) 194 which converts amplified receive signals into digital signals; and the like.

The wireless communication system in this embodiment is provided with two control loops: feedback control loop for phase control and feedback control loop for amplitude control. (In this specification, the former is designated as phase control loop or sub-phase control loop, and the latter is designated as amplitude control loop.)

The high frequency IC 100 comprises: a phase shifter-frequency divider circuit 110 which divides an oscillation signal φIF with a frequency of, for example, 640 MHZ, generated at the oscillator IF-VCO, and generates a signal with an intermediate frequency of 80 MHz whose phase is shifted by 90°; a quadrature modulation circuit 120 which mixes I/Q signals supplied from the baseband IC 300 with signals whose frequency is divided through the phase shifter-frequency divider circuit 110, and carries out quadrature modulation; a mixer 131 which mixes together a feedback signal from the transmission oscillator TxVCO and an oscillation signal φRF from the high frequency oscillator RF-VCO and down converts the mixed signal into a signal of 80 MHZ; a phase detection circuit 140 which detects the phase difference between the output signal of the mixer 131 and the output signal of the quadrature modulation circuit 120; a mixer 132 which mixes together the detection signal of the coupler 220 for detecting the output level of the power amplifier 210 and the oscillation signal φRF from the high frequency oscillator RF-VCO; a feedback-side variable gain amplifier circuit MVGA which amplifies the output of the mixer 132; an amplitude detection circuit 150 which compares a signal amplified through the amplifier circuit MVGA with the output signal of the quadrature modulation circuit 120, and detects the amplitude difference; a loop filter LPF2 which generates voltage in proportion to the output of the amplitude detection circuit 150, and further limits the frequency band of the amplitude control loop; a forward path-side variable gain amplifier circuit IVGA which amplifies signals passed through the loop filter LPF2; a current-voltage converter VIC; a gain control circuit 160 which controls the gain of the variable gain amplifier circuits MVGA and IVGA; a register 170 for setting control information internal to the chip, operation mode, and the like; a control circuit 180 which controls the circuits internal to the chip based on the set values on the register 170; and the like.

The control circuit 180 is constituted so that it has the function of a sequencer, and generates timing signals for operating the internal circuits in predetermined order in accordance with input commands from the external baseband IC 300 and specified operation mode.

The loop which runs from the coupler 220 to the mixer 132 to the variable gain amplifier circuit MVGA to the amplitude detection circuit 150 to the loop filter LPF2 to the variable gain amplifier circuit IVGA and finally to the power amplifier 210 constitutes the amplitude control loop. The loop which runs from the phase detection circuit 140 to the loop filter LPF1 to the transmission oscillator TxVCO to the mixer 131 and finally to the phase detection circuit 140 constitutes the phase control loop. In this embodiment, the loop filter LPF1 which limits the band of the phase control loop comprises external capacitors C0 and C1 and a resistor R1 connected in series with C1, though its constitution is not specially limited to this.

In the high frequency IC 100 in this embodiment, the following operation takes place: if there is any phase difference between an output signal of the quadrature modulation circuit 120 and a feedback signal from the mixer 131, such a voltage as to reduce this difference is supplied to the frequency control terminal of the transmission oscillator TxVCO. Thus, control is carried out so that the phase of the feedback signal from the mixer 131 will be matched with the phase of the output signal of the quadrature modulation circuit 120. With this phase control loop, control is carried out so that the phase of the output of the transmission oscillator TxVCO will not become improper as the result of supply voltage fluctuation or temperature change. The output level of the transmission oscillator TxVCO is constant (approximately 10 dBm).

Further, the high frequency IC 100 in this embodiment is constituted so that the output of the variable gain amplifier circuit MVGA will be supplied both to the phase detection circuit 140 and to the amplitude detection circuit 150. Therefore, the path which runs from the coupler 220 to the mixer 132 and finally to the variable gain amplifier circuit MVGA is used as a feedback path common to the amplitude control loop and the phase control loop. For this purpose, a changeover switch SW0 is provided. The setting of the switch SW0 is changed by the control circuit 180 according to the state of setting of the register 170 carried out by the baseband IC 300.

In EDGE mode, the output of the power amplifier 210 contains both the phase modulation component and the amplitude modulation component. Therefore, either of the output of the transmission oscillator TxVCO and the output of the power amplifier 210 may be used as a feedback signal to the phase detection circuit 140 which has the output-side phase component. However, the phase control loop cannot be locked by a feedback signal from the amplitude control loop at start of transmission because the output of the power amplifier 210 has not risen yet.

Further, the feedback path of the amplitude control loop is indispensable to EDGE mode in order to correct distortion produced in the power amplifier. For this reason, after the loop is locked, the feedback path may be shared between the amplitude control loop and the phase control loop, and the TxVCO-side sub-phase control loop including the mixer 131 may be interrupted. As a result, the power consumption can be reduced, and phase modulation can be carried out with higher accuracy.

In this embodiment, consequently, the switch SW0 is operated as follows: when the output rises, the switch setting is changed to the position to select the sub-phase control loop, that is, feedback signals from the mixer 131. After the loop is stabilized, the switch setting is changed to the position to select the feedback path, that is, signals from the variable gain amplifier circuit MVGA. (In this specification, this loop is designated as main phase control loop for discrimination from the sub-phase control loop.) Thus, after the loop is stabilized, control is carried out so that the phase of the output of the power amplifier 210 will be matched with the phase of a signal SREF from the modulation circuit 120. As a result, phase control can be implemented with higher accuracy than the control with the sub-phase control loop.

The loop filter LPF1 on the sub-phase control loop comprises capacitors C0 and C1 and a resistor R1 connected in series with C1. The values of the capacitors and the resistor are determined with consideration given to GMSK modulation mode wherein only phase modulation is carried out. Then, the values are determined so that the frequency band of the loop filter LPF1 will be such a frequency band as 1.2 MHz at which the degree of noise suppression is enhanced.

Further, this embodiment is so constituted that the sub-phase control loop can be used both in GMSK modulation mode and in 8-PSK modulation mode. More specifically, the embodiment is provided with a resistor R2 in parallel with the resistor R1 in the loop filter LPF1 and a switch SW1 in series with the resistor R2. The embodiment is so constituted that when this switch SW1 is turned on, the frequency band of the loop filter LPF1 is expanded to 1.8 MHz. That is, in 8-PSK modulation mode, the frequency band of the loop filter LPF1 is set to 1.8 MHz which is the same as that of the amplitude control loop. As a result, the operation is stabilized. In GMSK modulation mode, turning off the switch sets the frequency band of the loop filter LPF1 to 1.2 MHz narrower than that of the amplitude control loop. Thus, the stability of the loop and the degree of noise suppression can be enhanced.

In the transmission-system circuit over the high frequency IC 100 in this embodiment, the following operation takes place in 8-PSK modulation mode: after the loop is stabilized, the output power of the power amplifier 210 is detected by the coupler 220 in the amplitude control loop. The resultant detection signal is mixed with an oscillation signal φRF from the high frequency oscillator RF-VCO at the mixer 132 and thereby converted into a signal of intermediate frequency (IF). Then, the signal is amplified through the variable gain amplifier circuit MVGA, and is supplied as a feedback signal SFB to the amplitude detection circuit 150.

Then, the feedback signal SFB is compared with a signal SREF, modulated through the quadrature modulation circuit 120, in the amplitude detection circuit 150, and the amplitude difference is detected. This amplitude difference is supplied to the variable gain amplifier circuit IVGA through the loop filter LPF2, and is amplified there. Then, the amplified amplitude difference is applied to as control voltage VAPC to the output control terminal of the power amplifier 210, and amplitude control is carried out.

Further, this embodiment is provided with a charge pump CGP and a level shift circuit LVS in the stage subsequent to the variable gain amplifier circuit IVGA. The charge pump CGP carries out charge-up or discharge by the differential outputs of the variable gain amplifier circuit IVGA, and integrates the output current of the variable gain amplifier circuit IVGA. The level shift circuit LVS shifts the voltage generated by the charge pump to the negative side by approximately 0.6V. The charge pump CGP comprises a pair of current sources IS1 and IS2 and a capacitor C4. The reason why the level shift circuit LVS is provided is as follows: while the power module 200 is required to be capable of applying down to 0V as control voltage, the charge pump CGP in this embodiment is incapable of outputting 0V because of the properties of the current source IS2.

In this embodiment, the power amplifier 210 comprises FET and the like. A driving voltage (Vdd) corresponding to the control voltage VAPC is generated through a voltage control circuit (not shown) provided in the power module 200, and is applied to the drain terminal or source terminal of the FET. An appropriate bias voltage VBIAS generated in the baseband IC 300 or a bias circuit (not shown) is applied to the gate terminal of the power FET.

Here, gain control with respect to the variable gain amplifier circuit IVGA in the forward path and the variable gain amplifier circuit MVGA in the feedback path will be described.

In a cellular phone terminal supporting EDGE or GSM, such power control that the output power POU of a power amplifier is increased or reduced to a desired value in a certain period of time is carried out. The system in this embodiment which adopts the polar-loop transmitter method implements this power control by controlling the gain of the variable gain amplifier circuit MVGA. More specific description will be given. When the gain of the variable gain amplifier circuit MVGA is reduced, the feedback signal SFB to the amplitude detector 150 is reduced. Therefore, the amplitude control loop acts so as to increase the RF gain GPA (POUT/PIN) of the power amplifier to match the feedback signal SFB with the reference signal SREF from the modulation circuit.

Thus, when the gain of the variable gain amplifier circuit MVGA is reduced, the output power POUT is increased. If the output power POUT is to be reduced, the gain of the variable gain amplifier circuit MVGA can be increased. In this embodiment, control of the gain of the variable gain amplifier circuit MVGA is carried out by control voltage VRAMP from the baseband IC 300. Further, to stabilize the amplitude control loop, the rate of decrease or increase in the gain GMVGA of the variable gain amplifier circuit MVGA is constantly matched with the rate of increase or decrease in the gain GIVGA of the variable gain amplifier circuit IVGA.

Meanwhile, the reference signal SREF supplied from the quadrature modulation circuit 120 to the phase detector 140 and the amplitude detector 150 is a signal modulated by 8-PSK. Though the amplitude component and the phase component are varied, control is carried out so that the following will be implemented by the action of the amplitude control loop: variation in the amplitude component of the output power POUT of the power amplifier will be matched with variation in the amplitude component of the reference signal SREF. In addition, control is carried out so that the following will also be implemented by the action of the phase control loop: variation in the phase component of the output power POUT of the power amplifier will be matched with variation in the phase component of the reference signal SREF. As a result, the output of the power amplifier becomes modulated output which is highly approximate to modulation inherent in 8-PSK modulation signals generated through the quadrature modulation circuit 120. At this time, the output power POUT of the power amplifier 210 is made equal to a desired value by the above-mentioned power control.

Further, some elements, though not shown in FIG. 1, are provided in the feedback path of the sub-phase control loop. An attenuator is provided between the transmission oscillator TxVCO and the mixer 131 which attenuator attenuates the output of the oscillator TxVCO and supplies it to the mixer 131. A low pass filter for removing harmonics is provided between the mixer 131 and the phase detection circuit 140. Meanwhile, some elements, though not shown in the figure, are also provided in the feedback path of the amplitude control loop. An attenuator is provided between the coupler 220 and the mixer 132. Low pass filters for removing unwanted waves and harmonics, respectively, are provided between the mixer 132 and the variable gain amplifier circuit MVGA and between the variable gain amplifier circuit MVGA and the amplitude detection circuit 150.

Next, referring to FIG. 2, the high frequency IC 100 according to the present invention wherein the transmission oscillator TxVCO is provided at its output end with anti-crosstalk measures will be described. Also, the constitution and action of a first embodiment of a module mounted with the high frequency IC 100 will be described with reference to FIG. 2.

Figure 2:
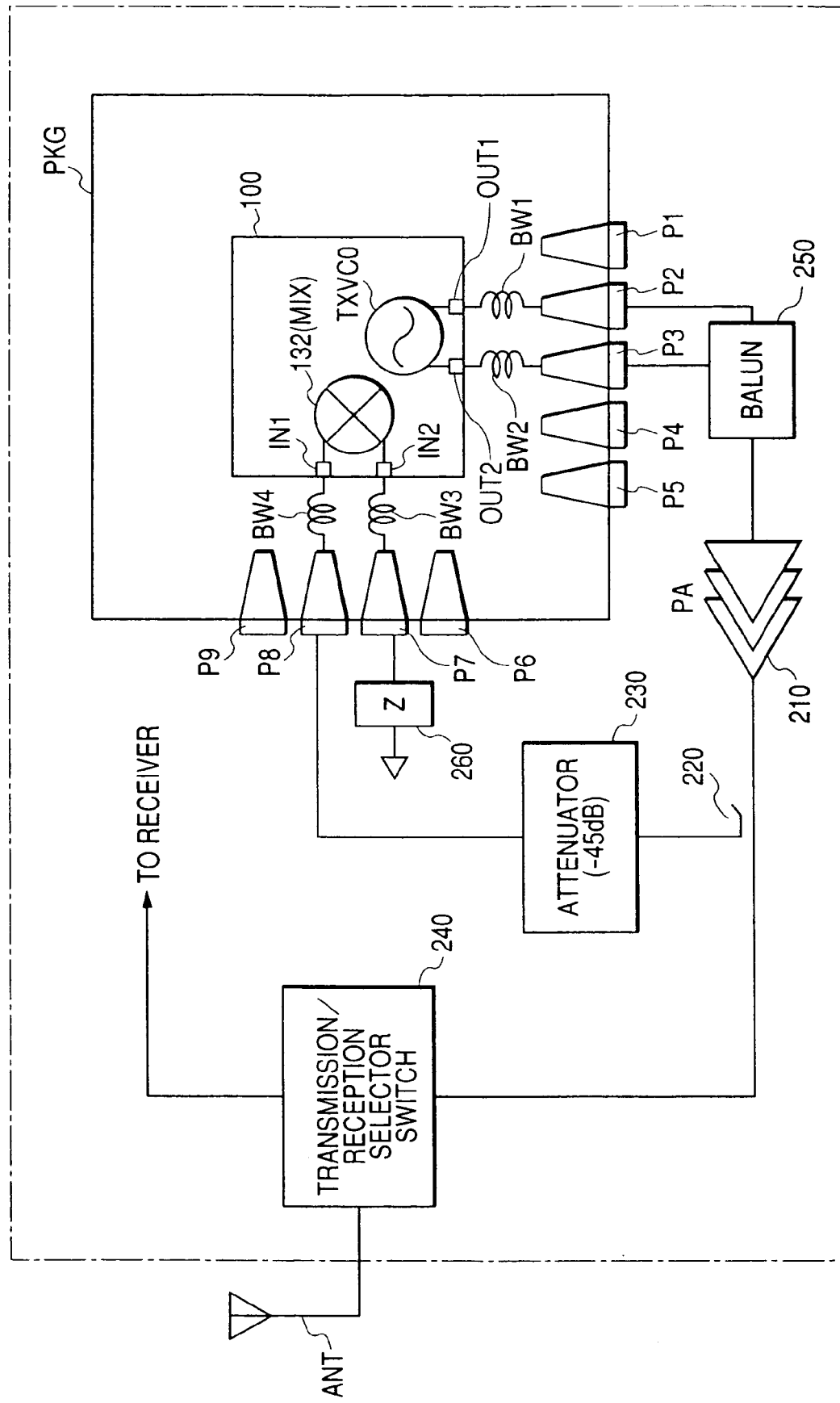
FIG. 2 is a circuitry diagram illustrating a high frequency semiconductor integrated circuit device which constitutes the polar-loop transmitter wireless communication system in FIG. 1, and a first embodiment of an RF module mounted with the high frequency semiconductor integrated circuit device and a power amplifier.

FIG. 2 illustrates what is constituted as a module by mounting the following elements over one insulating substrate, such as ceramic substrate: a high frequency IC 100 which constitutes the polar-loop transmitter wireless communication system in FIG. 1; a power amplifier 210; a coupler 220 which detects the output level of the power amplifier 210; an attenuator 230 which attenuates signals detected by the coupler 220; and a transmission/reception selector switch 240. The high frequency IC 100 is mounted as is sealed in a package. In this specification, the high frequency IC 100 sealed in a package is designated as high frequency semiconductor integrated circuit device. Further, what is obtained by mounting the high frequency semiconductor integrated circuit device, a power amplifier 210, a coupler 220, and the like over an insulating substrate is designated as RF module or wireless electric unit.

In FIG. 2, code 100 denotes a high frequency IC chip; PKG denotes a package which seals the high frequency IC 100; P1 to P9 denote pins as lead terminals provided on the package; BW1 to BW4 denote bonding wires for connecting pads over the high frequency IC chip 100 with corresponding lead terminals.

If the high frequency IC 100 is so constituted that it supports three transmission methods: GSM at 800 MHz, DCS at 1800 MHz, and PCS (Personal Communications System) at 1900 MHz, the following constitution may be adopted: two TxVCO's are provided, and two power amplifiers 210 and two couplers 220 are provided accordingly. Even in this case, however, a common TxVCO, power amplifier, and coupler may be used for generation, amplification, and detection of transmit signals. This is because the frequency band of DCS (1800 MHz) and that of PCS (1900 MHz) are close to each other.

In this embodiment, the attenuator circuit 230 comprises a π-type attenuator which uses a resistor and is provided with an attenuation factor of, for example, −45 dB, though its constitution is not limited to this. The transmission oscillator TxVCO incorporated in the high frequency IC 100 is provided with differential output configuration. To enable the output of transmit signals in positive phase and in opposite phase, it is provided with two external terminals OUT1 and OUT2 each comprising a bonding pad. Also, the package PKG which seals the high frequency IC chip 100 is provided with two lead terminals P2 and P3 corresponding to the two external terminals OUT1 and OUT2.

In addition, a circuit 250 designated as balun is mounted over the substrate of the RF module. The balun 250 is for converting differential signals outputted through the lead terminals P2 and P3 into single signals. Connection between the lead terminals P2 and P3 and the balun 250 and connection between the balun 250 and the power amplifier 210 are provided by printed wiring or the like formed over the substrate of the RF module. The power amplifier 210 comprises one or several ICs and elements, such as capacitor.

Further, in this embodiment, the package PKG and the high frequency IC chip 100 are respectively provided with the following terminals: a lead terminal P8 fed with signals from the coupler 220, attenuated at the attenuator 230 and an input terminal IN1 comprising a bonding pad; and a dummy input pin P7 and a dummy input terminal IN2. In addition, a mixer 132 is accordingly constituted as a circuit of differential input configuration. A detection signal of the coupler 220 is inputted to the mixer 132, and is combined there with an oscillation signal φRF from the high frequency oscillator RF-VCO. The mixer 132 thereby carries out down convert. To ensure that the substantial impedance of the input pin P7 is 50Ω, the dummy input pin P7 is connected with a ground point through a conjugate impedance matching circuit 260 or the like. The conjugate impedance matching circuit 260 comprises a variable resistor and a capacitor element in parallel.

In this embodiment, the transmission oscillator TxVCO is provided with differential output configuration. To ensure the output of its differential transmit signals, the embodiment is provided with the two external terminals OUT1 and OUT2 and the two lead terminals P2 and P3. And these terminals are connected together through the bonding wires BW1 and BW2, respectively. For this reason, the phase of an electromagnetic field produced at one output end is shifted from the phase of an electromagnetic field produced at the other output end by 180°. As a result, the electromagnetic fields cancel out and weaken each other.

Thus, noise and crosstalk are suppressed. The noise jumps from the differential output terminals OUT1 and OUT2 of the transmission oscillator TxVCO or the lead terminals P2 and P3. Then, it goes into the lead terminals P7 and PB and the input pads IN1 and IN2 to which detection signals of the coupler 220 are inputted. The level of suppression is lower than the level of the detection signal from the coupler 220 which are inputted to the lead terminals P7 and P8 and the input pads IN1 and IN2 when the power amplifier 210 is at the minimum level at transmission.

As mentioned above, the mixer 132 to which the detection signal of the coupler 220 is inputted is constituted as a circuit of differential input configuration. Further, the dummy input pin P7 and the dummy input terminal IN2 are provided. Therefore, even if noises jump in from the output terminals of the transmission oscillator TxVCO, they are inputted as in-phase noises to the mixer 132. For this reason, the noises are canceled out, and the noise level is lowered. This prevents degradation in the signal-to-noise ratio of signals inputted to the mixer 132 and the resulting degradation in the accuracy of feedback control by the amplitude control loop.

Figure 3:
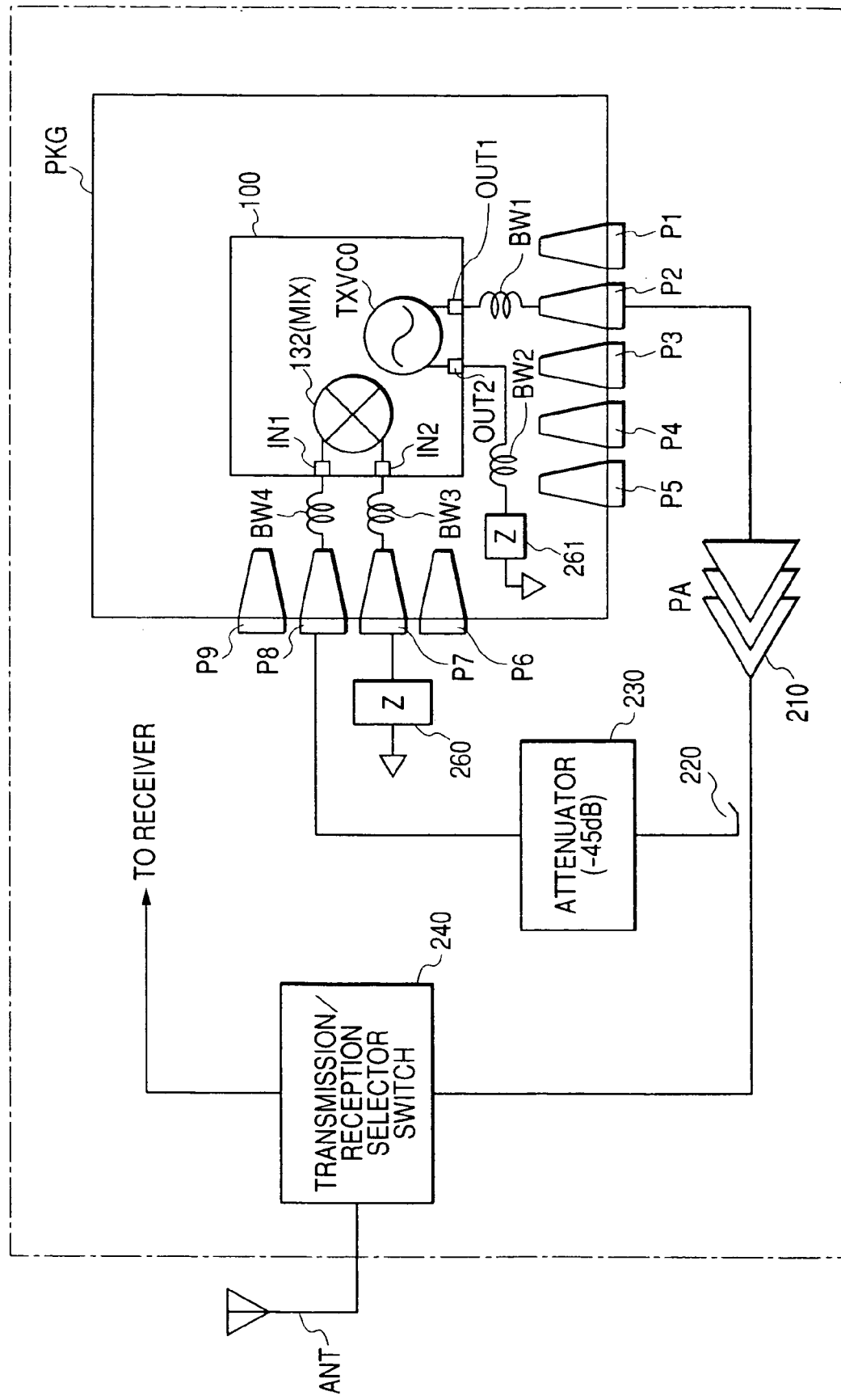
FIG. 3 is a circuitry diagram illustrating a high frequency IC which constitutes the polar-loop transmitter wireless communication system in FIG. 1, and a second embodiment of an RF module mounted with the high frequency IC and a power amplifier.

Next, referring to FIG. 3, the high frequency IC 100 according to the present invention wherein the transmission oscillator TxVCO is provided at its output end with anti-crosstalk measures will be described. Also, a second embodiment of an RF module mounted with the high frequency IC 100 will be described. In FIG. 3, the same regions and circuits as in FIG. 2 will be marked with the same codes, and duplicate description will be omitted.

As mentioned above, the first embodiment is provided with the output terminal P3 for transmit signals in opposite phase. In the second embodiment, alternatively, an equivalent impedance circuit 261 is sealed in the package PKG of the high frequency IC. The equivalent impedance circuit 261 has an impedance equivalent to the impedance on the side of the output terminal P2 for transmit signals. That is, the equivalent impedance circuit 261 has an impedance equivalent to the impedance between the other end of the bonding wire BW1 connected with one output terminal OUT1 of the transmission oscillator TxVCO and the input terminal of the power amplifier 210. At the same time, the output pad OUT2 connected with one output terminal of the transmission oscillator TxVCO and the equivalent impedance circuit 261 are connected with each other through a bonding wire BW2. With respect to the other aspects of constitution, the second embodiment is the same as the first embodiment. With such a constitution, the same effect as in the first embodiment can be obtained. In addition, according to the second embodiment, the number of lead terminals provided on the package PKG can be reduced, and the reduction of package size can be accomplished.

Figure 4:
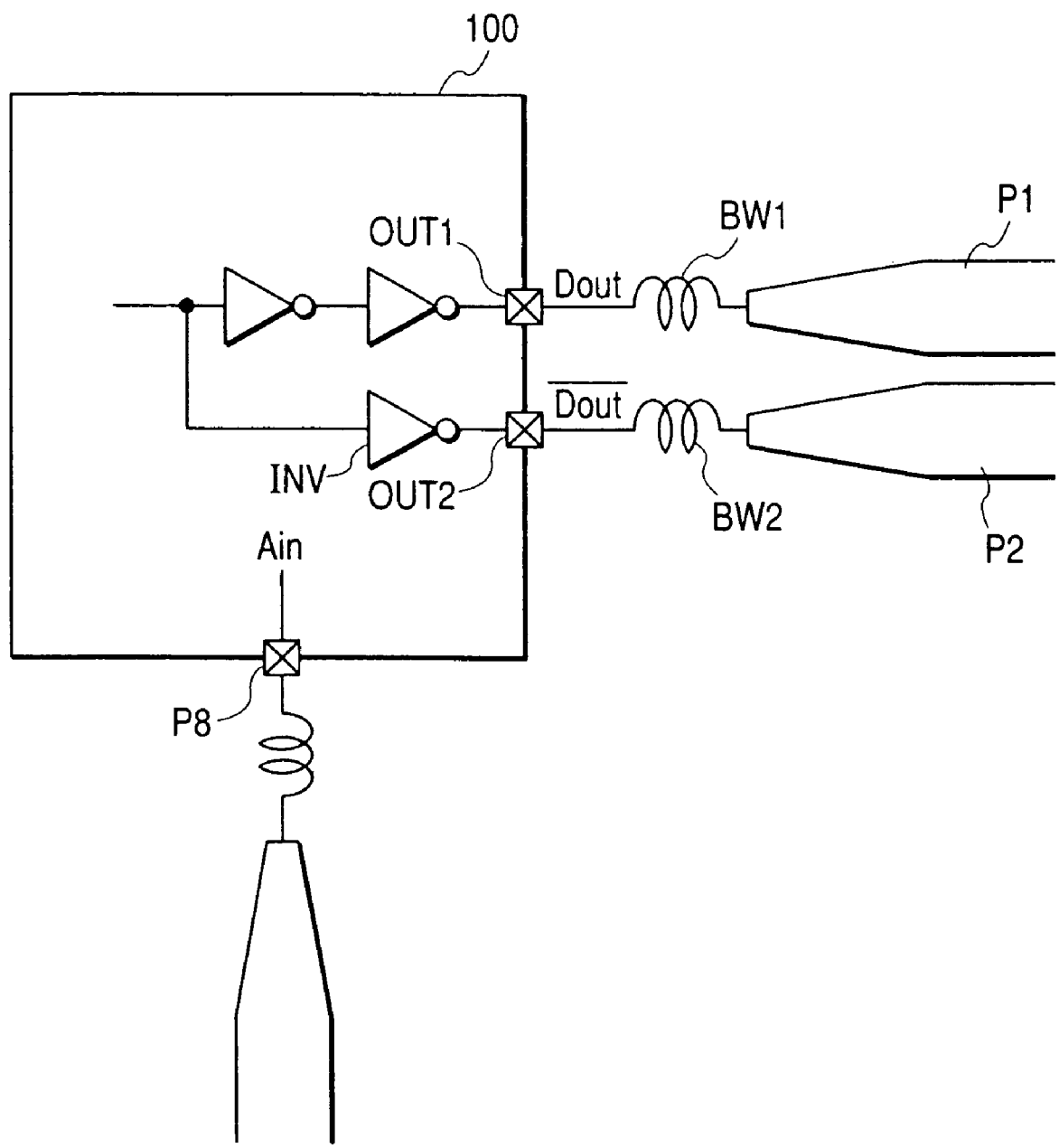
FIG. 4 is a schematic diagram illustrating another embodiment of the high frequency semiconductor integrated circuit device according to the present invention.

Next, referring to FIG. 4, another embodiment of the high frequency IC 100 according to the present invention will be described.

In this embodiment, the output terminals for digital signals are provided with anti-crosstalk measures. More specifically, the output stage for digital signals is provided with an inverter INV which inverts positive-phase signals Dout to generate opposite-phase signals /Dout. In addition, two output terminals OUT1 and OUT2 for outputting positive-phase signals Dout and opposite-phase signals /Dout and two lead terminals P1 and P2 are provided, and they are connected together through bonding wires BW1 and BW2. Thus, coupling noise between output terminals for digital signals and an input terminal P8 for other analog signals Ain and crosstalk can be suppressed.

Various signals are possible as such a digital signal. In case of the high frequency IC in FIG. 1, one example is signals outputted from the A-D conversion circuit 194. The A-D conversion circuit 194 is provided in the stage subsequent to the high gain amplifier circuit (PGA) 193 and converts receive signals from analog to digital and supplies them to the baseband circuit 300. The A-D conversion circuit 194 is provided with differential output configuration, and thereby electromagnetic fields produced at the output end are caused to cancel out each other. Thus, noise due to digital output or crosstalk is prevented from coupling or being introduced into a terminal to which receive signals Rx from the antenna ANT are inputted. Instead of the provision of the lead terminal P2 connected with the output terminal OUT2, the following constitution may be adopted: an impedance similar with the equivalent impedance circuit 261 illustrated in FIG. 3 is provided, and it is connected through the bonding wire BW2.

Figure 5:
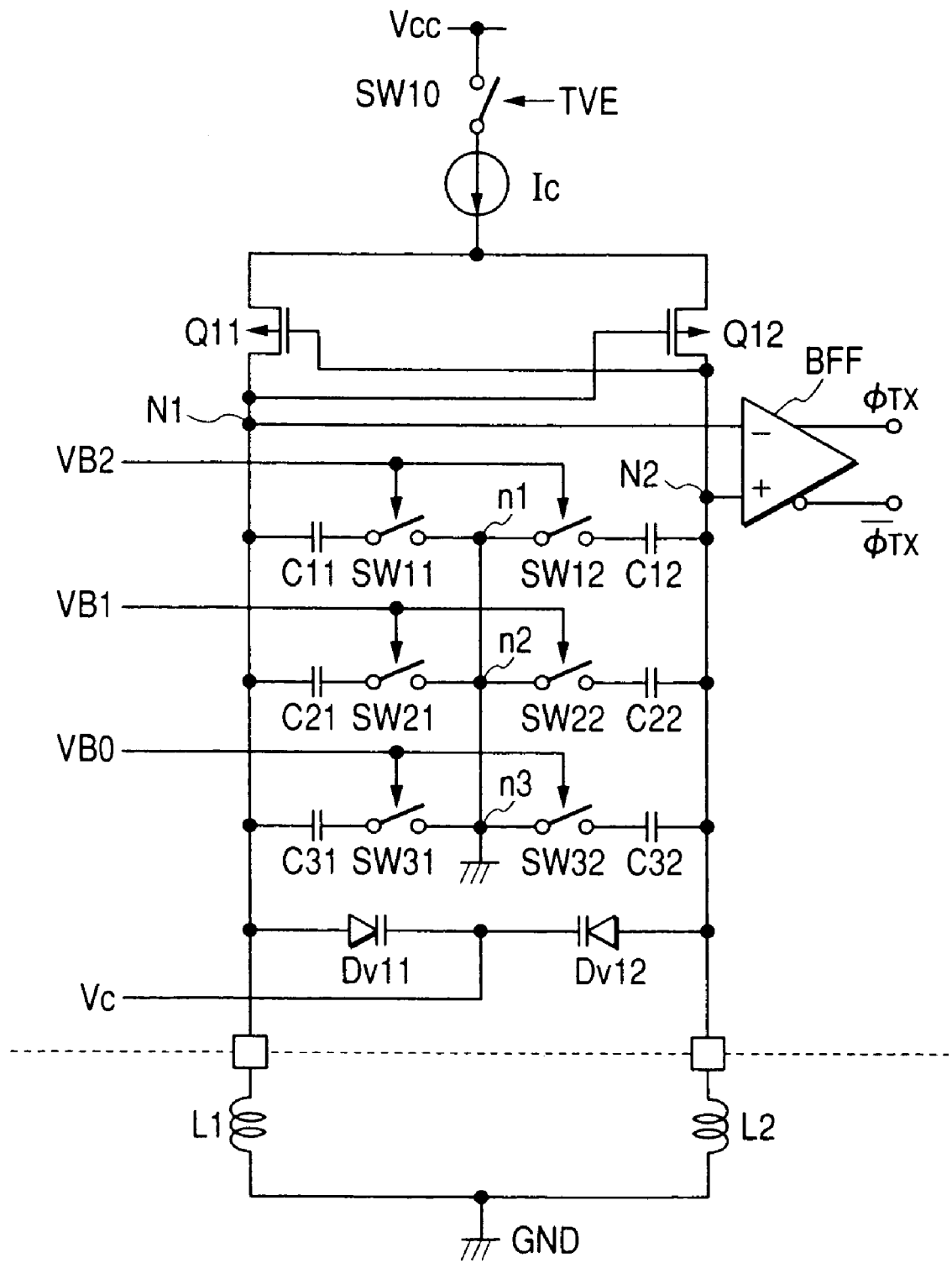
FIG. 5 is a circuit diagram illustrating an example of a transmission oscillator used in the embodiments of the present invention.

FIG. 5 illustrates an LC resonance oscillation circuit as an embodiment of the transmission oscillator TxVCO of differential output configuration.

The oscillation circuit in this embodiment comprises: a pair of p-channel MOS transistors Q11 and Q12 whose sources are connected with each other and whose gates and drains are cross-linked with each other; a constant current source Ic connected between the common source of the transistors Q11 and Q12 and a supply voltage terminal Vcc; a switch SW10 connected in serial with the constant current source Ic; inductors (coils) L1 and L2 respectively connected between the drains of the transistors Q11 and Q12 and a ground point GND; a first series circuit including a capacitor C11, switches SW11 and SW12, and a capacitor C12 connected in series between the drain terminals of the transistors Q11 and Q12; a second series circuit which is connected in parallel with the first series circuit and includes a capacitor C21, switches SW21 and SW22, and a capacitor C22; a third series circuit which is connected in parallel with the first series circuit and includes a capacitor C31, switches SW31 and SW32, and a capacitor C32; varactor diodes Dv11 and Dv12 as variable capacitor elements connected in series between the drain terminals of the transistors Q11 and Q12; a buffer BFF of differential input-differential output configuration whose input terminals are connected with the drain-side nodes N1 and N2 of the transistors Q11 and Q12. The varactor diodes Dv11 and Dv12 can be formed of p-channel MOS transistors. Q11 and Q12 may be bipolar transistors.

The switches SW11 to SW32 are on/off controlled by band selection signals VB2 to VB0 from the control circuit 180 illustrated in FIG. 1. Thus, the frequency of oscillation of TxVCO is varied stepwise. The oscillation circuit is so constituted that: control voltage Vc from the loop filter LPF1 is applied to one-side terminals of the varactor diodes Dv11 and Dv12, and thus the frequency is continuously controlled.

More specific description will be given. When the number of the switches SW11 to SW32 which are brought into on state is increased, the values of the capacitors connected between the drain terminals of the transistors Q11 and Q12 are increased. As a result, the frequency of oscillation is lowered. Meanwhile, when the number of the switches which are brought into on state is reduced, the frequency of oscillation is increased. These switches SW11 to SW32 are selectively turned on according to the frequency band used.

The switch SW10 provided in series with the constant current source Ic is a switch for starting. When this switch is turned on, the oscillation circuit starts oscillating operation, and when the switch SW10 is turned off, the oscillation circuit stops oscillating operation. Instead of the provision of the switch SW10, the oscillation circuit may be so constituted that the constant current source Ic is directly on/off controlled. The switch SW10 is controlled by a switching signal TVE outputted from the control circuit 180.

In the high frequency IC 100 in the embodiment illustrated in FIG. 1, on-chip elements are used for inductors which constitute the high frequency oscillator RFVCO comprising the LC resonance oscillation circuit and the oscillator IFVCO for intermediate frequency. With respect to the transmission oscillator TxVCO, meanwhile, external elements are used for the inductors L1 and L2 in TxVCO for GSM. The inductors L1 and L2 in TxVCO for DCS/PCS are incorporated into IC. This is because use of on-chip inductors in TxVCO for GSM makes it difficult to obtain sufficient Q (quality factor).

Figure 6:
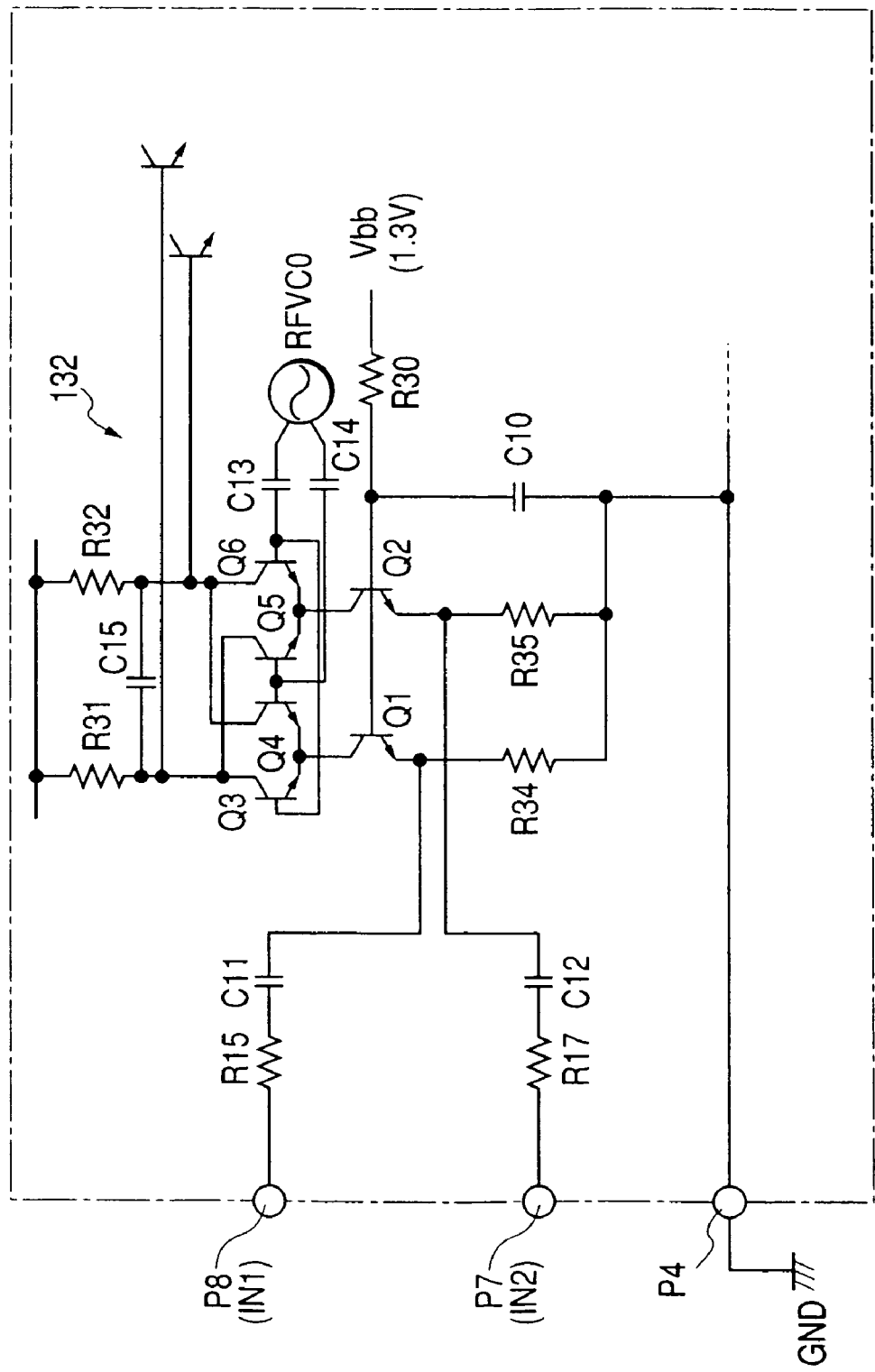
FIG. 6 is a circuit diagram illustrating an example of a mixer used in the embodiments of the present invention.

FIG. 6 illustrates an example of the circuit of the mixer 132.

The mixer circuit in this embodiment uses a differential circuit designated as Gilbert cell though its constitution is not limited to this. Such a mixer comprising a Gilbert cell can be operated as a single input circuit by using the following procedure: the base terminal of one of the differential input transistors Q1 and Q2 is fed with the detection signal of the coupler 220. At the same time, the base terminal of the other transistor is fed with the intermediate potential of the detection signal of the coupler 220. Thus, the number of pins can be reduced.

The prior invention (Japanese Patent Application No. 2003-54042) proposed by the present inventors et al. is on the assumption that such a single input mixer is used. As mentioned above, however, this embodiment adopts the following constitution to prevent degradation in the accuracy of feedback control due to coupling noise from the output pins P2 and P3 of TxVCO: in addition to the regular input pin P8 (input terminal IN1) for detection signals, the dummy input pin P7 (input terminal IN2) is provided. The emitter terminal of one (Q2 in FIG. 6) of the differential input transistors constituting the mixer 132 is connected with the dummy input pin P7 through a resistor R17 and a capacitor C12. This dummy input pin P7 is connected to a ground point through the conjugate impedance matching circuit 260 and the like outside the chip.

Thus, the same noise as the coupling noise from the output pins of TxVCO to the input pin P8 for detection signals is inputted to the differential input transistors through the dummy input pin P7. As a result, the common mode noise suicide effect of a differential circuit can be used to reduce the amount of noise. In the mixer 132 illustrated in FIG. 6, bias voltage Vbb which gives an operating point (amplitude center potential) is applied to the bases of the differential input transistors Q1 and Q2 through a resistor R30.

Further, pairs of transistors Q3 and Q4 and Q5 and Q6 whose emitters are connected together are connected with the collectors of the differential input transistors Q1 and Q2. The collectors of Q3 and Q5 are connected with a common load resistance R36, and the collectors of Q4 and Q6 are connected with a common load resistance R37. Oscillation signals φRF and/φRF from the high frequency oscillator RFVCO are inputted to the bases of Q3 to Q6 through capacitors C13 and C14. The detection signal associated with the output of the power amplifier, inputted through the input pin PB, is combined with the oscillation signal φRF. Thereby a signal containing the frequency component corresponding to the frequency difference between them is outputted.

Further, in the mixer circuit in this embodiment, a capacitor element C10 is provided between the bases of the transistors Q1 and Q2 and a ground line connected with the ground pin P4. Thus, noise which jumped from the output pins P2 and P3 of TxVCO into the ground pin P4 is transmitted to the bases of the transistors Q1 and Q2 through the capacitor element C10. Further, it is transmitted from the ground potential of the mixer 132 to the emitters of the transistors Q1 and Q2 through resistors R34 and R35. For this reason, the base-emitter voltage of the transistors Q1 and Q2 does not have any gain with respect to the noise around the ground line. As a result, the circuit in FIG. 6 becomes favorable in CMRR (Common Mode Rejection Ratio).

Up to this point, the invention made by the present inventors has been specifically described. However, the present invention is not limited to the above embodiments, and needless to add, it may be modified in various manners to the extent that its subject matter is not departed from.

Some examples will be taken. With respect to the above embodiments, it has been described that external elements are used for the inductors L1 and L2 in TxVCO for GSM. If on-chip inductors having desired characteristics are available, external elements need not be used. Further, with respect to the above embodiments, a case where the transmission oscillator TxVCO is incorporated into the high frequency IC 100 has been described. If as a circuit external to a high frequency IC 100, a transmission oscillator TxVCO is sealed in the same package as the high frequency IC 100, the present invention is similarly applicable.

Further, with respect to the above embodiments, an example wherein such a Gilbert circuit as illustrated in FIG. 6 is used as the mixer circuit 132 has been shown. The Gilbert circuit uses grounded-base transistors with their emitters for input as differential input transistors. The constitution of the mixer circuit is not limited to this. Alternatively, it may be constituted as a circuit which uses grounded-emitter differential input transistors Q1 and Q2 with their bases for input.

Further, with respect to the above embodiments, a case where the present invention is applied to a polar-loop transmitter wireless communication system having the phase control loop and the amplitude control loop has been described. However, the present invention is applicable to a wide range of high frequency semiconductor integrated circuit devices having the following constitution: the major parts of a transmission oscillator are formed over a chip; oscillation signals are outputted through external terminals; and detection signals associated with the output of a power amplifier are externally fed back. One example is a system wherein an offset PLL high frequency IC is provided only with the phase control loop and carries out phase modulation, such as GMSK modulation. In this system, signals from a coupler external to the chip are fed back to a phase detection circuit.

Up to this point, a case where the present invention is applied to a triple band system capable of communication in three methods: GSM method, DCS1800 method, and PCS1900 method. The present invention is applicable to systems listed below and a high frequency semiconductor integrated circuit device used in the systems. Such systems include: system so constituted that it is capable of communication in any one of the GSM, DCS, and PCS methods; dual band system capable of any two methods of them; and quad band system.

The following is a brief description of the gist of the representative elements of the invention laid open in this application:

According to the present invention, a transmission oscillator is incorporated into a high frequency IC. As a result, in a wireless communication system having two feedback control loops, phase control loop and amplitude control loop, the following advantages are brought: the number of components constituting the system can be reduced; the packaging density can be enhanced; and thus, its size and cost can be reduced.

Further, in a wireless communication system having a feedback control loop for controlling the output power of a power amplifier, the following advantages are brought: if a transmission oscillator is incorporated into a high frequency semiconductor integrated circuit device constituting the system, the accuracy of control of the output power of the power amplifier is prevented from being degraded. This degradation is caused by noise which jumps from the output pins of the transmission oscillator into an input pin for detection signals associated with the output level of the power amplifier or crosstalk.

What is claimed is:

1. A high frequency semiconductor circuit device comprising:
   a transmission oscillator which outputs differential signals, the differential signals including a first differential signal and a second differential signal;
   a first external terminal for outputting the first differential signal generated at the transmission oscillator;
   a phase detection circuit which compares the phase of a reference signal with the phase of a feedback signal and controls said transmission oscillator according to phase difference of these signals;
   a second external terminal for receiving externally supplied signals;
   a first mixer circuit which combines a signal inputted to the second external terminal with a signal of a predetermined frequency; and
   an equivalent impedance circuit having an impedance equivalent to the impedance between one output terminal of said transmission oscillator and said first external terminal,
   wherein one output terminal of said transmission oscillator of differential output configuration and said first external terminal are connected by a first bonding wire, and the other output terminal of said transmission oscillator and one terminal of said equivalent impedance circuit are connected by a second bonding wire, so that said first differential signal is outputted to external of the high frequency semiconductor circuit device via said first external terminal and said second differential signal is provided to the equivalent impedance circuit.

2. A high frequency semiconductor circuit device according to claim 1,
   wherein a signal which is generated by combining a signal inputted to said second external terminal with said signal of a predetermined frequency through said first mixer circuit can be supplied as said feedback signal to said phase detection circuit.

3. A high frequency semiconductor circuit device according to claim 2, which comprises:
   an amplitude detection circuit which compares the amplitude of a signal generated by combining a signal inputted to said second external terminal with said signal of a predetermined frequency through said first mixer circuit with the amplitude of said reference signal and generates a signal corresponding to the amplitude difference; and
   a third external terminal for outputting voltage corresponding to the output of the amplitude detection circuit.

4. A high frequency semiconductor circuit device according to claim 1,
   wherein said transmission oscillator, said phase detection circuit, and said first mixer circuit are formed over a same semiconductor chip.

5. A high frequency semiconductor circuit device according to claim 1,
   wherein said first mixer circuit comprises a differential circuit including a pair of differential input terminals, one differential input terminal of said first mixer circuit is connected with said second external terminal, and the other differential input terminal of said first mixer circuit is connected with a fourth external terminal.

6. A high frequency semiconductor circuit device according to claim 1,
   wherein said first mixer circuit generates a signal of the frequency corresponding to the difference between the frequency of a signal inputted to said second external terminal and the frequency of said signal of a predetermined frequency.

7. A high frequency semiconductor circuit device according to claim 1, which further comprises:
   an oscillator which generates said signal of a predetermined frequency; and
   a second mixer circuit which combines a signal generated at said oscillator with a signal generated at said transmission oscillator and generates a signal having a frequency component corresponding to the frequency difference between the signals,
   wherein said output signal of the second mixer circuit is arranged to be supplied to said phase detection circuit.

8. A semiconductor device comprising:
   a transmission oscillator which outputs a first differential signal and a second differential signal;
   a first external terminal which outputs the first differential signal;
   a phase detection circuit which compares the phase of a reference signal with the phase of a feedback signal and controls said transmission oscillator according to phase difference of these signals;
   a second external terminal which receives externally supplied signals;
   a first mixer circuit which combines a signal inputted to the second external terminal with a signal of a predetermined frequency; and
   an equivalent impedance circuit having an impedance equivalent to the impedance between an output terminal of said transmission oscillator and said first external terminal,
   wherein one output terminal of said transmission oscillator and said first external terminal are connected by a first bonding wire, and another output terminal of said transmission oscillator and one terminal of said equivalent impedance circuit are connected by a second bonding wire, and
   wherein said second differential signal is provided to the equivalent impedance circuit.

9. A semiconductor device according to claim 8,
   wherein a signal which is generated by combining a signal inputted to said second external terminal with said signal of a predetermined frequency through said first mixer circuit can be supplied as said feedback signal to said phase detection circuit.

10. A semiconductor device according to claim 9, which comprises:
    an amplitude detection circuit which compares the amplitude of a signal generated by combining a signal inputted to said second external terminal with said signal of a predetermined frequency through said first mixer circuit with the amplitude of said reference signal and generates a signal corresponding to the amplitude difference; and
a third external terminal for outputting voltage corresponding to the output of the amplitude detection circuit.

11. A semiconductor device according to claim 8,
wherein said transmission oscillator, said phase detection circuit, and said first mixer circuit are together formed over a single semiconductor chip.

12. A semiconductor device according to claim 8,
wherein said first mixer circuit comprises a differential circuit including a pair of differential input terminals, one differential input terminal of said first mixer circuit is connected with said second external terminal, and the other differential input terminal of said first mixer circuit is connected with a fourth external terminal.

13. A semiconductor device according to claim 8,
wherein said first mixer circuit generates a signal of the frequency corresponding to the difference between the frequency of a signal inputted to said second external terminal and the frequency of said signal of a predetermined frequency.

14. A semiconductor device according to claim 8, which further comprises:
an oscillator which generates said signal of a predetermined frequency; and
a second mixer circuit which combines a signal generated at said oscillator with a signal generated at said transmission oscillator and generates a signal having a frequency component corresponding to the frequency difference between the signals,
wherein said output signal of the second mixer circuit is arranged to be supplied to said phase detection circuit.

* * * * *